(12) United States Patent  
Dubrulle et al.

(10) Patent No.: US 10,394,729 B2  
(45) Date of Patent: Aug. 27, 2019

(54) SPECULATIVE AND ITERATIVE EXECUTION OF DELAYED DATA FLOW GRAPHS

(71) Applicant: COMMISSARIAT A L'ENERGIE ATOMIQUE ET AUX ENERGIES ALTERNATIVES, Paris (FR)

(72) Inventors: Paul Dubrulle, Paris (FR); Thierry Goubier, Velizy (FR); Stéphane Louise, Orsay (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 182 days.

(21) Appl. No.: 15/509,836

(22) PCT Filed: Sep. 22, 2015

(86) PCT No.: PCT/EP2015/071692  
§ 371 (c)(1),  
(2) Date: Mar. 8, 2017

(87) PCT Pub. No.: WO2016/046187  
PCT Pub. Date: Mar. 31, 2016

(65) Prior Publication Data  
US 2017/0308489 A1  Oct. 26, 2017

(30) Foreign Application Priority Data  
Sep. 23, 2014 (FR) .................................. 14 58979

(51) Int. Cl.  
*G06F 9/455* (2018.01)  
*G06F 9/52* (2006.01)  
(Continued)

(52) U.S. Cl.  
CPC ................ *G06F 13/24* (2013.01); *G06F 1/10* (2013.01); *G06F 8/40* (2013.01); *G06F 9/4887* (2013.01);  
(Continued)

(58) Field of Classification Search  
CPC .......... G06F 13/24; G06F 13/423; G06F 1/08; G06F 1/10; G06F 8/40; G06F 8/433;  
(Continued)

(56) References Cited

U.S. PATENT DOCUMENTS 5,021,947 A * 6/1991 Campbell ............. G06F 9/4494  
712/25  
5,745,687 A  4/1998 Randell  
(Continued)

FOREIGN PATENT DOCUMENTS

EP  1 672 501 A2  6/2006

OTHER PUBLICATIONS

Marco Solinas et al., "The TERAFLUX Project: Exploiting the DataFlow Paradigm in Next Generation Teradevices," 2013 IEEE 16th Euromicro Conference on Digital System Design, Sep. 4, 2013, pp. 272-279, XP032502906.  
(Continued)

*Primary Examiner* — Daniel H Pan  
(74) *Attorney, Agent, or Firm* — Baker & Hostetler LLP

(57) ABSTRACT

A system for executing a data flow graph comprises: at least two first actors each comprising means for independently executing a computation of a same data set comprising at least one datum, and producing a quality descriptor of the data set, the execution of the computation by each of at least two first actors being triggered by a synchronization system; a third actor, comprising means for triggering the execution of the computation by each of at least two first actors, and initializing a clock configured to emit an interrupt signal  
(Continued)

when a duration has elapsed; a fourth actor, comprising means for executing, at the latest at the interrupt signal from the clock: the selection, from the set of at least two first actors having produced a quality descriptor, of the one whose descriptor exhibits the most favorable value; the transfer of the data set computed by the selected actor.

14 Claims, 5 Drawing Sheets

(51) Int. Cl.
*G06F 11/16* (2006.01)
*G06F 11/34* (2006.01)
*G06F 1/10* (2006.01)
*G06F 13/24* (2006.01)
*G06F 17/50* (2006.01)
*G06F 15/82* (2006.01)
*G06F 9/48* (2006.01)
*G06F 8/40* (2018.01)
*G06F 8/35* (2018.01)
*G06F 8/41* (2018.01)

(52) U.S. Cl.
CPC ............ *G06F 9/528* (2013.01); *G06F 11/165* (2013.01); *G06F 8/35* (2013.01); *G06F 8/433* (2013.01); *G06F 9/455* (2013.01); *G06F 9/4812* (2013.01); *G06F 11/3447* (2013.01); *G06F 15/825* (2013.01); *G06F 17/5022* (2013.01)

(58) Field of Classification Search
CPC ...... G06F 8/458; G06F 9/4812; G06F 9/4887; G06F 9/528; G06F 9/52; G06F 11/165; G06F 15/82; G06F 15/825; G06F 8/34; G06F 8/35; G06F 11/3447; G06F 9/455; G06F 7/78; G06F 5/06; G06F 17/5022; G06F 13/243; G06N 99/005; G06N 3/02; G06N 3/08; G06N 99/00
USPC ........ 712/18, 25, 201, 220, 227; 706/12, 20, 706/22, 45–61; 713/401, 502, 503; 710/29, 48, 61, 266; 703/22
See application file for complete search history.

(56) References Cited

U.S. PATENT DOCUMENTS

| | | |
|---|---|---|
| 6,397,192 B1 | 5/2002 | Notani et al. |
| 2002/0184553 A1* | 12/2002 | Frolund ............. G06F 11/2048 714/4.4 |
| 2005/0138485 A1 | 6/2005 | Osecky et al. |
| 2006/0274659 A1* | 12/2006 | Ouderkirk ............. H04L 41/145 370/241 |
| 2007/0203871 A1* | 8/2007 | Tesauro ................. G06Q 10/06 706/53 |
| 2008/0079961 A1* | 4/2008 | Borodin ............. G06F 11/3684 358/1.9 |
| 2008/0127200 A1* | 5/2008 | Richards ............ G06F 11/3664 718/106 |

OTHER PUBLICATIONS

J. Mitola, "The software radio architecture," Communications Magazine, IEEE, vol. 33, No. 5, May 1995, pp. 26-38.

\* cited by examiner

SPECULATIVE AND ITERATIVE EXECUTION OF DELAYED DATA FLOW GRAPHS

CROSS-REFERENCE TO RELATED APPLICATIONS

This application is a National Stage of International patent application PCT/EP2015/071692, filed on Sep. 22, 2015, which claims priority to foreign French patent application No. FR 1458979, filed on Sep. 23, 2014, the disclosures of which are incorporated by reference in their entirety.

FIELD OF THE INVENTION

The present invention relates to the execution of data flow graphs with distributed computations. More specifically, it relates to the execution of data flow graphs when there is an uncertainty as to the execution of some actors of the graph.

BACKGROUND

Since the beginning of the new millennium, there has been a qualitative change in the progress in microprocessor and microelectronics architectures. Moore's law, which provides the roadmap for the state of the art in microelectronics etching processes continues to be borne out, since the number of transistors that can be placed on a chip still doubles approximately every 20 to 24 months. However, the use of additional transistors is currently caused by the increase in the number of computation cores, more than by the increase in the computation power of each of the cores.

Thus, the workstation processors already have a significant number of cores per physical processor: between 8 and 16 at the current time. If this trend continues, in the coming years the number of cores per chip will exceed several tens. In fact, there are already a few processors that have several hundreds of cores per chip. For example, the MPPA-256 processor from Kalray which has 256 computation cores and twenty or so cores for managing the parallelism and inputs/outputs.

Such processors are called many core processors. The distinction between multicore and many core is not reduced solely to the number of cores. The most noteworthy difference is more specifically linked to the manner in which the processor cores communicate. In a conventional multicore, the cores have a shared bus for accessing the main memory. In principle, the shared bus allows a good perception of the memory accesses from all the cores. It is thus relatively easy to implement memory consistency methods to ensure that all the cores have the same view of the central memory of the system. These principles are still in force in processors commonly accessible at the present time, through a bus architecture which adds a few nuances to the preceding scheme. Generally, the workstation processors with 8 or 16 cores are referred to by the acronym NUMA, for Non-Uniform Memory Access. For these processors, the memory access is not uniform between the computation cores, but the data consistency remains achievable.

In the context of a many core processor where the number of computation cores is particularly high, the possibility of establishing memory consistency on a large scale on all the cores is more problematical. Without becoming impossible, its cost in terms of synchronization counterbalances the saving in execution time generated by the parallelism, the benefit of which can be compromised thereby. In effect, for this, it is necessary to involve distributed protocols but protocols that include some shared elements. It is therefore an overall unsatisfactory solution, all the more so as the memory consistency induces a not inconsiderable electrical consumption. In order to address this problem, a significant amount of the research on many core execution methods is focused on computation models which do not need memory consistency. Among these, the data flow models are these days a particular study subject.

The abovementioned hardware trends induce a deep mutation in the embedded computation, and allow for the emergence of new applications, of which some, in fields as varied as high-performance computation or embedded critical real-time systems, entail both strong needs in terms of parallelism and real-time constraints. By way of example, J. Mitola. *The software radio architecture*. Communications Magazine, IEEE, 33(5):26-38, May 1995 describes a software radio application and M. Heskamp, R. Schiphorst, and K. Slump. *Cognitive Radio Communications and Networks*, chapter Public safety and cognitive radio, pages 467-488. Elsevier, 2009 describes a cognitive radio system. Each of these applications demands high computation power coupled with low electrical consumption. Both present real-time constraints and cognitive radio presents a need for adaptability to its environment. Similar constraints are encountered in the augmented reality applications, for example those described by S. Feiner, B. MacIntyre, T. Hollerer, and A. Webster. *A touring machine: prototyping 3d mobile augmented reality systems for exploring the urban environment*. In Wearable Computers, 1997. Digest of Papers., First International Symposium on, pages 74-81, October 1997 and Y. Sato, M. Nakamoto, Y. Tamaki, T. Sasama, I. Sakita, Y. Nakajima, M. Monden, and S. Tamura. *Image guidance of breast cancer surgery using* 3d ultrasound images and augmented reality visualization, 1998, as well as autonomous vehicle applications described by A. Kushleyev, D. Mellinger, C. Powers, and V. Kumar. *Towards a swarm of agile micro quadrotors*. Autonomous Robots, 35(4):287-300, 2013.

The connectivity is another important aspect in the current technological trends. More and more smartphone appliances, from the smart sensor to the smartphone, have the possibility of being connected permanently to one another. Each of these mobile appliances can be connected to remote servers or embedded systems, such as, for example, the embedded system of a car. Atzori, A. Iera, and G. Morabito. 54(15):2787-2805, October 2010. *The internet of things: A survey*. Comput. Network discloses a swarm of mobile computers creating a global computation platform, highly parallel and mutable. This article lays the groundwork for an omnipresent and distributed computation capacity.

Thus, the applications cited previously can be seen as parts of a cooperative computation, in which each application can use the results of other applications to improve its own. A. A. Faisul, A. R. Ramli, K. Samsudin, and S. Hashim. *Energy management in mobile robotics system based on biologically inspired honeybees behavior*. In Computer Applications and Industrial Electronics (ICCAIE), 2011 IEEE International Conference on, pages 32-35. IEEE, 2011, in the field of energy management in mobile robotics, and Y. Wang, Y. Qi, and Y. Li. *Memory-based multiagent coevolution modeling for robust moving object tracking*. The Scientific World Journal, 2013, 2013 in the field of robust target tracking, now discloses such applications, which require dynamisms, knowledge of the environment and adaptation thereto.

The data flow models and more particularly the networks of communicating were first devised by Kahn in 1974. They make communications between tasks explicit, which allows for an analysis of the application offline to check important properties for safe and deterministic execution.

Many data flow models use the concept of actor introduced by Carl Hewitt; Peter Bishop; Richard Steiger (1973). *A Universal Modular Actor Formalism for Artificial Intelligence*. IJCAI. In the context of this concept and of the associated mathematical model called actor model, the actors are the only primitive functions necessary to concurrent programming. The actors communicate by the exchange of messages. In response to a message, an actor can for example perform a local processing operation, create other actors, or send other messages.

The basic KPN (Kahn Parallel Network) principle is founded on a graph whose nodes are communicating processes and whose links are queues (more commonly called FIFO, the acronym for First In First Out). The processes can read data on the input channels and write the results of their computations on output channels. The granularity of the data exchanged is denoted by tokens and the number of tokens produced and consumed are positive or zero integer numbers.

The reads on the input channels are blocking, which means that, if a process requires more tokens than there are present on one of its inputs, it will be blocked until the number of tokens required is present on said input. The processes have the right to have an internal state and can dynamically change the number of tokens awaited at the input or produced at the output.

The Kahn model is powerful, gives deterministic results (the same inputs produce the same outputs), local (therefore without the need to have memory consistency mechanisms), but it lacks properties to be able to use it in total confidence in the context of embedded computing. In particular, it is possible to know in advance if a Kahn process network has no blockages or if it will be able to be executed in bounded memory.

There are a number of KPN enhancements to allow off-line checks on the properties essential for the determinism and the dependability. Among these enhancements, the CSDF (Cyclo-Static Data Flow) model is the most expressive which retains the possibility of conducting these checks. K. Denolf, M. Bekooij, J. Cockx, D. Verkest, and H. Corporaal, Exploiting the expressiveness of cyclo-static dataflow to model multimedia implementations. EURASIP Journal on Advances in Signal Processing, 2007(1): 084078, 2007 describes possible analyses of CSDF graphs. In addition, with the information on the execution times of the actors and the latencies induced by the communications, a CSDF graph can be analyzed to determine the latencies on a path of the graph.

The patent FR 28166730 describes a securing method that makes the real-time execution of multitask application deterministic. It describes in particular the sequencings of system calls and interrupts, clocks, and management of interruptions at the microkernel level allowing for a task to be executed in real time deterministically.

The patent U.S. Pat. No. 5,745,687 describes a data flow management system implemented on computer. This system notably comprises an organization service, intended to identify, out of a set of agents, the most appropriate agent to perform each of the tasks of the data flow graph.

The patent U.S. Pat. No. 6,397,192 describes a method for synchronizing one or more data flow graphs. It notably describes how to pause and start/restart the execution of the data flow graph as a function of the termination or non-termination of tasks.

However, none of the techniques described previously makes it possible to ensure the correct execution of the data flow graph in the case of failure of one of the agents. The risk of failure becomes not inconsiderable with the expansion of the distributed computations and of the network connections. By way of example, an agent of a data flow graph can invoke a computation resource situated on an external network. A connection problem, by its nature unpredictable, can then threaten the determinism of the execution, or of the time of execution, of the task performed by the agent. Similarly, when an agent executes a task requiring external elements, for example the reception of GPS signals, it is very difficult to ensure the task execution determinism. In the case of a CSDF graph, the token system blocks the execution of the graph until all the data awaited have arrived. The patent FR 28166730 makes it possible to obtain a deterministic response time for a real-time task, but does not broach the issue of the possible failure of certain actors. The patent U.S. Pat. No. 5,745,687 does not deal with this problem and the patent U.S. Pat. No. 6,397,192 describes a synchronization mechanism in which the tasks await the end of execution of other tasks, but does not describe a mechanism that makes it possible to overcome the failure thereof.

Furthermore, when several agents are likely to perform the same task with different result qualities, none of the abovementioned methods makes it possible to select a posteriori the one that has produced the best result. The tasks that can be performed by different agents with a result of variable quality include, for example, geolocation by different means, or image analysis with different result qualities. The patent U.S. Pat. No. 5,745,687 does indeed make it possible to select the most appropriate agent to perform a task, but it is an a priori selection of the agent, and not an a posteriori selection of agents that have already terminated their task and that are capable of quantifying the quality of their result.

Finally, none of the above methods makes it possible to create deterministic graphs guaranteeing the provision of a result both within a limited time and of the best possible quality out of the results supplied by several agents being running in parallel.

SUMMARY OF THE INVENTION

To this end, the subject of the invention is a system for executing a data flow graph 300, said data flow graph 300 comprising: at least two first actors 310, 311 each comprising means for independently executing a computation of a same data set comprising at least one datum, and producing a quality descriptor of the data set, the execution of the computation by each of said at least two first actors being triggered by a synchronization system; a third actor 320, comprising means for triggering the execution of the computation by each of said at least two first actors, and initializing a clock configured to emit an interrupt signal when a duration has elapsed; a fourth actor 330, comprising means for executing, at the latest at the interrupt signal from said clock: the selection, from the set of said at least two first actors having produced a quality descriptor, of the one whose descriptor exhibits the most favorable value; the transfer of the data set computed by the selected actor.

Advantageously, at least one of said two first actors 310, 311 has a deterministic execution time less than or equal to the clock duration.

In one embodiment of the invention, the synchronization system of each of said at least two first actors 310, 311 is a semaphore, and the third actor 320 triggers the execution of the computation by each of said at least two first actors 310, 311 by giving a token to said semaphore.

In one embodiment of the invention, the third actor 320 comprises means for transferring data representing identical computation parameters 420b, 421b, 422b to each of said at least two first actors 310, 311, prior to the initialization of the clock.

Advantageously, each of the at least two first actors 310, 311 produces a timestamp at the end of the transfer of the data representing computation parameters, and the third actor 320 triggers the initialization of the clock after the reception of the at least two timestamps.

In one embodiment of the invention, the third actor 320 triggers the execution of a subset only of the at least two first actors, as a function of a parameter external to said third actor indicating the subset of the at least two first actors to be executed 411b.

Advantageously, the subset of the at least two first actors 310, 311 to be executed comprises all those for which the appropriate computation means are available.

In one embodiment of the invention, the fourth actor 340 comprises means for generating an error, when, at the interrupt signal from the clock, the number out of the at least two first actors 310, 311 having produced a quality descriptor is below a predefined threshold.

In one embodiment of the invention, the selection of the actor whose quality criterion exhibits the most favorable value is performed at the interrupt signal from the clock.

In another embodiment of the invention, the selection of the actor whose quality criterion exhibits the most favorable value is performed before the interrupt signal from the clock, when at least a predefined number out of the at least two first actors have produced a quality descriptor.

In one embodiment of the invention, at least one out of the at least two first actors produces an update of the computation of its data set, and of its quality descriptor.

The invention relates also to a method for compiling a data flow graph, said method comprising a step of creation of at least two groups of instructions of a computer code corresponding to at least two first actors 310, 311, for independently executing the computation of a same data set comprising at least one datum, and producing a quality descriptor of the data set, the execution of the computation by each of said at least two groups of instructions of a computer code being triggered by a synchronization system; a step of verification that at least one out of the at least two groups of instructions of a computer code is capable of executing its computation deterministically within a predefined duration 620; a step of creation of a third group of instructions of a computer code corresponding to a third actor 320, to trigger the execution of the computation by each of said at least two first groups of instructions of a computer code, and initializing a clock configured to emit an interrupt signal when said predefined duration is terminated; a step of creation of a fourth group of instructions of a computer code corresponding to a fourth actor 330 for executing, at the latest at the interrupt signal from said clock: the selection, from the set of said at least two first groups of instructions of a computer code having produced a quality descriptor, of the one whose descriptor exhibits the most favorable value; the transfer of the data set computed by the group of instructions of a selected computer code.

In one embodiment of the invention, the compilation method comprises, prior to the step of creation of at least two groups of instructions of a computer code corresponding to at least two first actors: a step of verification of the existence of the at least two first actors, of the third actor and of the fourth actor; a step of verification that the input channels of the at least two first actors are connected to the third actor; a step of verification that the output channels of the at least two first actors are connected to the fourth actor, a step of verification that the output channels of the third actor are connected to the at least two first actors; a step of verification that the input channels of the fourth actor are connected to the at least two first actors.

In one embodiment of the invention, the compilation method generates a compilation error when none of the at least two first groups of instructions of a computer code corresponding to at least two first actors is capable of executing its computation deterministically within a predefined duration.

The system according to the invention thus makes it possible to execute a data flow graph by ensuring that a result is obtained within a bounded time deterministically, while reserving the possibility of obtaining a more efficient result if it is available.

A system for executing a data flow graph according to the invention is robust to unforeseen events, such as network failures or GPS signal losses.

A system for executing a data flow graph according to the invention makes it possible to execute data graphs on many core processors.

A system for executing a data flow graph according to the invention makes it possible to obtain great flexibility in the best result selection rules, and to generate errors if a computation result is not obtained.

A system for executing a data flow graph according to the invention makes it possible to best exploit iterative computation algorithms. It notably makes it possible to select the best result supplied by an iterative computation algorithm on a given date, to compare this result to that produced by other iterative and non-iterative algorithms, and to terminate its execution earlier if the iterative algorithm has terminated its processing before the limit date initially planned.

A method for compiling a data flow graph according to the invention makes it possible to ensure that a result will be obtained within a bounded time deterministically.

BRIEF DESCRIPTION OF THE DRAWINGS

Other features will become apparent on reading the following detailed description, given by way of example and in a nonlimiting manner in light of the attached drawings which represent.

DETAILED DESCRIPTION

Hereinafter in the description, the implementation of the invention is illustrated by examples relating to the execution of data flow graphs of CSDF type. It should however be noted that the invention is not restricted to graphs of CSDF type. The invention is in particular applicable to the types of graphs for which it is possible to determine the latency of each branch offline, for example on compilation; for which it is possible to demonstrate the absence of deadlocks and which can be executed in bounded memory. The invention is thus applicable, for example, to the graphs of "Core Functional Dataflow" type.

Some acronyms commonly used in the technical field of the present application may be employed in the description and the figures. These acronyms are listed in the table below, with their full expression and their meaning.

| Acronym | Expression | Meaning |
| --- | --- | --- |
| ADAS | Advanced Driver Assistance System | A driving aid computation system, for example with automatic signpost identification. |
| CSDF | Cyclo Synchronous Data Flow | A development of the KPN computation model that makes it possible to verify, on compilation, the observance of time constraints. |
| FIFO | First In First Out | An IT computation model called "queue", in which the tasks are performed in their order of arrival. |
| GPS | Global Positioning Network | A satellite positioning system. |
| GSM | Global System for Mobile communications | A second generation digital standard for mobile telephony. Particularly suitable for conveying voice and includes location means between the antenna and a cell phone. |
| KPN | Kahn Parallel Network | A distributed computation mode. |
| NUMA | Non Uniform Memory Access | Describes multi-core processors in which the access to the shared memory by the different computation cores is not uniform. |

Figure 1A:
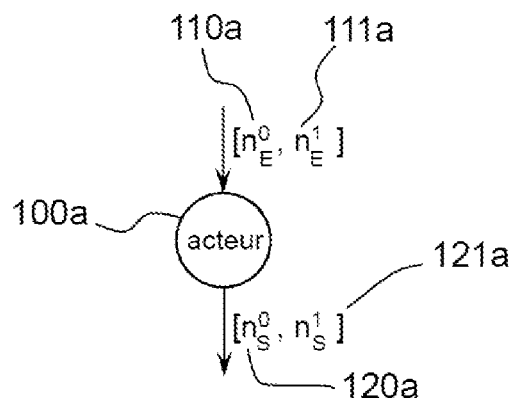
FIGS. 1a, 1b, 1c, three examples of CSDF actors according to the prior art.
Figure 1B:
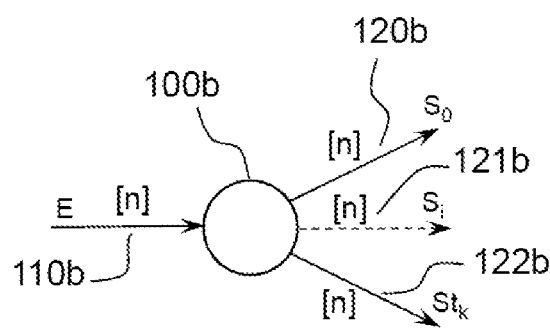
Figure 1C:
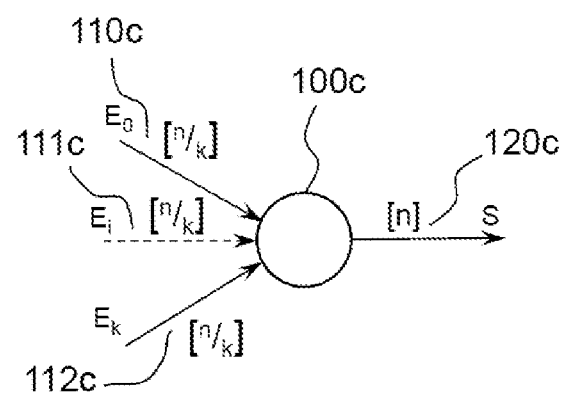

FIGS. 1a, 1b, 1c represent three examples of CSDF actors according to the prior art.

FIG. 1a represents an example of a single actor 100a according to the prior art. This actor comprises two functions $f_0$, $f_1$. The function $f_0$ consumes $n^0{}_E$ 110a tokens on the input channel and produces $n^0{}_S$ 120a of them on the output channel. The function consumes $n^1{}_E$ 111a tokens on the input channel and produces $n^1{}_S$ 121a tokens on the output channel. The tokens make it possible to synchronize the execution of the graph. In effect, the execution of the functions linked to an actor, for example $f_0$ and $f_1$ for the actor 100a, starts when all the tokens have been received on the input channel. Conversely, the production of tokens on the output channel makes it possible to trigger the execution of the following actors. Such an actor represents, in the CSDF model, the basic element of a computation module or of a computer program. Thus, the functions $f_0$, $f_1$ of the actor can perform, between its input and its output, a local computation processing, a network communication, or any other computing operation. Other single actors can comprise one, three, four or a plurality of inputs, outputs and computation functions.

FIG. 1b represents a second example of actor 100b of a CSDF graph according to the prior art. This actor, called "Duplicate", is used to duplicate the content of an input channel 110b comprising n elements into several output channels 120b, 121b, 122b comprising the same n elements. Other examples of "Duplicate" actors can comprise at least two output channels. The duplication of the data can be performed in different ways, for example by sending memory addresses pointing to a same data set, by copying the content of a memory into several separate locations, or by sending data to different recipients over a network. A similar actor, called "Split", splits the n elements of an input channel over several output channels each receiving a subset of the n elements of the input channel.

FIG. 1c represents a third example of actor 100c of a CSDF graph according to the prior art. This actor, called "Join", is used to concatenate data sets from three input channels 110c, 111c and 112c into one output channel 120c. Other examples of "Join" actors can comprise at least two input channels.

Figure 2:
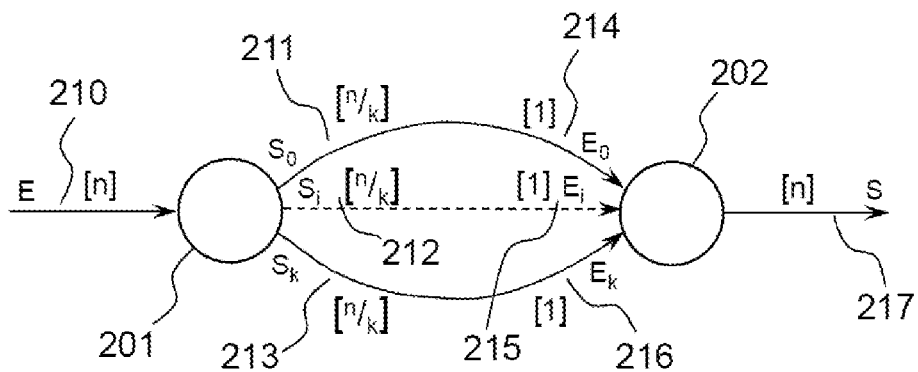
FIG. 2, an example of CSDF graph according to the prior art.

FIG. 2 represents an example of CSDF graph according to the prior art. This graph comprises:

A first "Split" actor 201;
A second "Join" actor 202;
An input channel 210;
Three output channels of the "Split" actor 211, 212, 213;
Three input channels of the "Join" actor 214, 215, 216
An output channel 217;

This graph makes it possible to reorganize data. To this end, the "Split" actor 201 splits the n data of the input channel 210 into three output channels 211, 212, 213. The "Join" actor 202 combines the three channels of 214, 215, 216 into one output channel 217. This allows access for the data in a different order, for example a matrix transposition.

Generally, the CSDF graphs find their true place in a part of the real-time problems: flow data processing operations, signal and video processing. They in fact have many desirable properties for real-time applications, such as the execution determinism, and the possibility of demonstrating the absence of blockage. It is thus possible to find sequencings which allow the CSDF graphs to be compatible with the real-time constraints. It is notably possible to guarantee the latency of a CSDF computation chain via the actors and the communication queues. However, the CSDFs have trouble adapting to a wide class of real-time applications, because, in the graphs of CSDF type, it is assumed that all the parts of the system are always functional. In effect, a failure in one actor of the CSDF graph blocks the execution of all the graph.

Now, a fundamental component of the real-time applications is the case of the critical applications or those which are at least partly critical. In that context, it cannot be assumed that an element of the system will always be functional, and in particular will send data to the computation subsystem. There is a wait for the real-time system to supply data at the outputs (for example the actuators in the so-called cyber-physical systems), even if some inputs do not send data (for transient or permanent failure problems). There are many causes for the non-supply of data at the outputs. For example, in the case of a computation, a failure can occur. Some computations, for example in the fields of cryptography or multimedia data processing, have an execution time dependent on the typology of the input data, which is intrinsically unpredictable. It is therefore very difficult to guarantee the provision of a result in a given time in this case. Finally, some actors are dependent on external conditions, for example the good reception of a GPS signal or of a network connection. These actors are then susceptible to unpredictable failures.

This is not compatible with the CSDF graphs because a CSDF actor always waits for a certain number of data on its inputs before being able to be executed. Of course, the CSDF graph can always be supplied with pseudo-inputs, via virtualized sources whose production is always controlled.

Generally, that pushes the problem back by one notch, because it must also be necessary to be able to react to the internal failures of a computation system. For a real-time system, the term failure (or fault) is fairly wide ranging, and covers in particular the case where a computation element is delayed relative to the expected timeouts.

The constraints of the embedded systems also require the electrical consumption of the system to be reduced as much as possible when safety is not compromised. Here again, it is a constraint that is incompatible with the CSDFs as such, because a graph does not change during execution.

Finally, since the real-world environment is complex, it is sometimes necessary to probabilistically arbitrate between several actions, because it is never possible to be 100% certain of the scenario currently running, with information given by the sensors which does not necessarily make it possible to know the subtleties of an event.

The CSDFs are therefore unsuited as such for treating these cases. The KPNs could in principle treat them. The use of KPN from the prior art does not make it possible to have an assurance as to the fundamental properties of these systems: the absence of block and the possibility of being executed in bounded memory or with a scheduling which observes time constraints. The invention makes it possible to overcome these prior art limitations.

Figure 3:
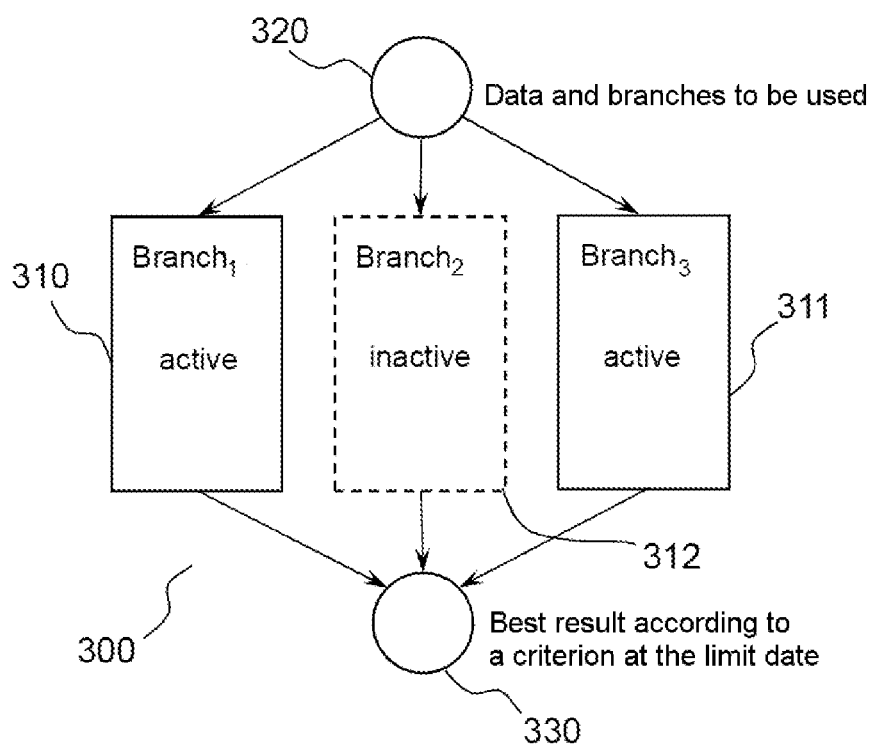
FIG. 3, a block diagram of a graph according to the invention.

FIG. 3 represents a block diagram of a graph according to the invention. In order to resolve the abovementioned drawbacks, the invention relates to a system for executing a data flow graph 300, said data flow graph 300 comprising:

at least two first actors 310, 311, comprising means for independently executing the computation of a same data set comprising at least one datum, and producing a quality descriptor on the result obtained, the execution of the computation by each of said at least two first actors being triggered by a synchronization system;

a third actor 320, comprising means for triggering the execution of the computation by each of said at least two first actors, and initializing a clock configured to emit an interrupt signal when a duration has elapsed;

a fourth actor 330, comprising means for executing, at the latest at the interrupt signal from said clock:

the selection, from the set of said at least two first actors having produced a quality descriptor, of the one whose descriptor exhibits the most favorable value;

the transfer of the data set computed by the selected actor.

The at least two first actors 310, 311 comprise means for independently executing the computation of a same datum or of a same data set, and producing a quality descriptor on the result obtained. The datum or the data set computed can be of very diverse types. As a nonlimiting example, it can be the location of an individual, or else the coding of an image in a video compression application. The quality descriptor then depends on the type of application chosen. For example, in the case of actors intended to locate a user, the quality descriptor can be the estimated accuracy of the location. In the case of the coding of an image in a video application, it can be an estimation of the weight/quality ratio of the video. If the video coding application allocates a fixed and predefined weight to each image, it can be a quality index on the image.

In one embodiment of the invention, these at least two actors comprise local computation functions using algorithms and complexities that are variable. In the example of the video coding, it can concern two different coding algorithms, each of them producing results that are more or less optimized according to the type of image. In another embodiment of the invention, some actors can make use of remote computation means, or data situated on a remote machine or else data received via a connection. For example, in the case of a location application, it is possible to have a first actor computing the position of a user by virtue of an odometer-based local computation (estimation of a new position by application of a displacement vector from a preceding position), a second actor computing the same position by virtue of the reception of GPS signals.

It is obviously possible to have more than two actors, for example with an additional actor 312, and to thus have additional means for performing the desired computation. Thus, in the case of the location application, it is possible to have a third actor using a location by identification of a radio communication signal reception beacon (cellular or Wi-Fi) to which is attached an equipment item to be located comprising a receiver. In one embodiment of the invention, a single actor is used for each of the computations. In a second embodiment of the invention, each of the computations is performed by a branch comprising several actors, and that can be compiled as a graph according to the prior art, for example a CSDF graph. In this application, "computation branch" or "independent computation branch" will be used to denote a subset of the graph intended to produce a computation result and a quality descriptor on said result, then send these two elements to a fourth actor 330, the execution of which is triggered by a third actor 320. Each of these branches comprises at least one actor.

The third actor 320 makes it possible to synchronize the execution of the graph, by synchronizing the startup of the at least two first actors 310, 311, and by initializing a clock configured to emit an interrupt signal when a duration has elapsed. This duration corresponds to the maximum execution time allowed to obtain a computation result for at least one actor while observing the real-time constraints. In one embodiment of the invention, this duration is fixed. For example, in the case of video compression, if the video is encoded at 25 images per second, and a graph 300 is executed to compress each image of the video, then the clock will have to be configured to a fixed duration of $\frac{1}{25}^{th}$ of a second to hold to the real-time constraints. It is also possible to configure the clock with a duration that is variable as a function of constraints internal or external to the application.

The fourth actor 330 makes it possible to select, at the latest at the interrupt signal from the clock initialized by the actor 320, the actor from the at least two first actors 310, 311 having the most favorable quality descriptor and to transfer the output data from this sensor as output data of the computation. Thus, the graph makes it possible to select, in a determined time making it possible to ensure the real-time constraints, the best possible computation result. The fourth actor can then transfer the most favorable output data, for example to another actor, another graph or a set of the graph. For example, in a graph intended for video compression, it can send the most favorable compressed image to an actor whose function is to record this compressed image in a file; in the case of a graph for location, the fourth actor can send the position of the user as output datum to an actor whose function is to display the position of the user on a plan.

In a set of embodiments of the invention, at least one of the two first actors has a deterministic execution time less than or equal to the clock duration. This makes it possible to ensure that a result will be available in a bounded time, while reserving the possibility of obtaining a result of better quality.

In the example of the video compression application, it is possible to configure a first actor to perform a compression of each image according to an algorithm having a deterministic computation time, for example less than $\frac{1}{25}^{th}$ of a second, and a second actor to perform a more powerful compression algorithm, but whose execution time varies as a function of the characteristics of each image. Thus, at the interrupt signal from the clock, the first actor has necessarily terminated its computation. In the case of an unfavorable image, the second actor has not terminated its own. The fourth actor 330 then selects the result supplied by the first actor, which is the only one available. In the case of a favorable image, the second actor has terminated its computation, with a quality descriptor, and therefore an image quality with equal weight, greater than that supplied by the first actor. The fourth actor then selects the computation result supplied by this second actor.

In the example of the location application, a first actor can compute the location of the user by odometry. This makes it possible, by virtue of a local computation in bounded time, to supply with certainty location coordinates at the interrupt signal from the clock, even with a high error margin. A second actor can be configured to locate the user using GPS signals. This positioning is much more accurate, but can fail in case of poor reception of the GPS signals. It can also supply a result that is more or less accurate based on the number of satellites supplying a signal. Thus, the fourth actor is capable of selecting, according to the execution context, the most accurate location, while being certain of having at least one location measurement.

In one embodiment of the invention, the third actor can trigger, as a function of an external parameter, the execution of a subset only of the at least two first actors. For example, it is possible to execute an actor 312 intended to compute the same datum as the actors 310 and 311 only in certain cases, or else to execute only the actor 310 as a function of the execution context of the graph. The execution or non-execution of certain actors can for example depend on the availability of computation means. For example, if an actor performs a part of its computations on a remote platform, it can be deactivated if the means of connection to this platform are unavailable. The execution or non-execution of the actors can also depend on the availability of computation or communication means. For example, an actor computing a location using a GPS system can be deactivated if the GPS signals are unavailable, or if a limited number of satellites are available. In another embodiment of the invention, the actors are activated or deactivated as a function of the computation power available or desired. For example, in a video coding application, it is possible to deactivate an actor using a resource-intensive computation algorithm in an "energy-saving" mode.

A graph 300 according to the invention can be compiled and executed as independent graph. It can also be compiled and executed as a module of a larger graph. The term "module of a graph according to the invention" or "module according to the invention" can then be used. A graph comprising a module 300 according to the invention can comprise other elements according to the prior art, the rest of the graph being able for example to be a conventional CSDF graph or contain other modules 300 according to the invention. In one set of modes of implementation of the invention, a module 300 of a graph according to the invention is called "TransactionModule".

FIGS. 4a, 4b, 4c, 4d, represent four examples of actors of a graph according to the invention. These actors are non-limiting examples making it possible to implement the invention, other actors being also possible.

Figure 4A:
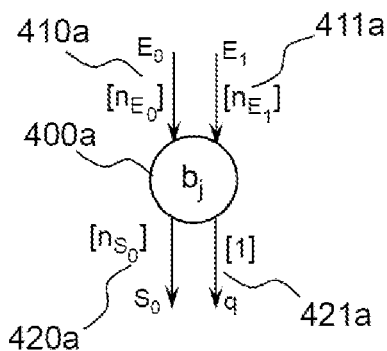
FIGS. 4a, 4b, 4c, 4d, four examples of actors of a graph according to the invention.

FIG. 4a represents an example of actor 400a of a graph according to the invention. This actor 400a can for example form one of the computation branches, or one of the at least two first actors comprising means for independently executing the computation of a same datum.

This actor comprises two input channels 410a, 411a. All the integer numbers greater than or equal to 1 of input channels are of course possible. It is for example possible to have 1, 2, 3, 4 or a plurality of input channels. The actor 400a can comprise means for performing any type of computer processing, for example a local computation, a distributed computation on a remote machine, retrieve data from a network or perform a computation requiring external data obtained using a sensor.

The actor 400a comprises a first output channel 420a, containing the computed datum. For example, if the actor 400a is intended to compute the location of a user, the first output channel 420a can contain coordinates of the user, according to different reference frames. In another example, if the actor 400a is intended to compute a compressed video image, the first output channel 420a can contain the compressed data, or a memory address of the compressed data.

The actor 400a also comprises a second output channel 421a, containing a quality descriptor on the computed data produced on the channel 420a. This descriptor is generic, and there are many possible quality representations. For example, the quality representation can be a percentage. It can also be a datum linked to the application concerned, for example an uncertainty on the position if the actor 400a is intended to compute a position, or a weight/quality ratio if the actor 400a is intended to encode a video image.

The execution of an actor 400a is triggered by a synchronization mechanism. The synchronization mechanisms are described generically by the different data flow models, notably by the principle of messages between the different actors. There are many synchronization mechanisms and implementations thereof available. In a set of embodiments of the invention, the synchronization mechanism of the actor 400a is a semaphore. In one embodiment of the invention, said semaphore comprises a token. The execution of the actor 400a then starts when a token is available in the semaphore, and the actor 400a takes possession thereof. In a set of embodiments of the invention, the actor 400a has a timestamping system enabling it to signal to other actors the end of the transfer of all of its input data.

Figure 4B:
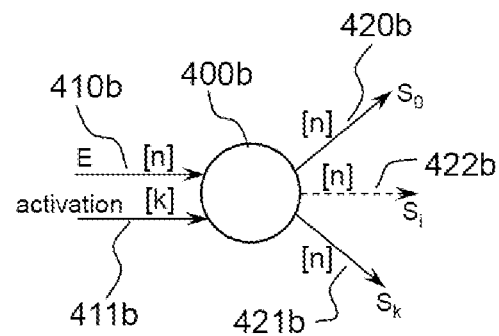

FIG. 4b represents an example of actor 400b of a graph according to the invention. This actor 400b can for example form the third actor 320 of a graph according to the invention. This actor, called "SelectDuplicate", has two inputs 410b and 411b, and one output per computation branch. This actor is intended to duplicate input data in order to supply identical computation parameters to each of the at least two first actors 310, 311 of a computation branch. It also makes it possible to synchronize the execution of these at least two first actors 310, 311 and initialize a clock to synchronize the end of their execution.

This actor 400b comprises a first input channel 410b. This input channel comprises the data to be supplied to the different computation branches. For example, in the case of a video coding application, it can be an image to be compressed. It also comprises one output channel per branch, each comprising the duplicated datum. It therefore comprises at least two output channels 420b and 421b, and optional output channels, for example the channel 422b.

The actor 400b also comprises a second input 411b. This input contains an external parameter indicating a subset of the at least two first actors 310, 311 to be executed. This input can for example take the form of a Boolean table whose size is equal to the number of output channels, the actor 400b triggering only the computation of the actors connected to an output channel whose value is set to "true" in the input channel 411b. The data from the input channel 411b indicating the actors to be executed can depend on many application parameters or contexts. For example, they can be derived from a user configuration file indicating the computation means to be used or not in an application. In the case or certain computations are executed on remote computation means, the subset of the actors to be executed described in the data from the input channel 411b can also comprise those for which the appropriate computation means are available. This subset can also depend on the graph execution context. For example, in the case of a graph intended to locate an individual, if an actor computes the position by odometry and a second using GPS signals, the second input 411b can indicate to execute only the actor using the odometry if the GPS signals are unavailable.

In a set of embodiments of the invention, the actor 400b transfers identical data to at least two first actors 310, 311 prior to the initialization of the clock. In one embodiment of the invention, the actor 400b triggers the execution of at least two first actors 310, 311 by giving a token in a semaphore. In a set of embodiments of the invention, each of the at least two first actors 310, 311 produces a timestamp at the end of the transfer of the data representing the computation parameters, and the actor 400b triggers the initialization of the clock after the reception of the at least two timestamps.

This actor 400b is given by way of example only, and other actors can occupy the place of an actor 320 in a graph according to the invention. For example, in a graph according to the invention with two actors 310, 311 not requiring input data, it is possible to have one actor 320 only intended to initialize the computation of the actors 310, 311 and a clock for the synchronization of the end thereof. In the case where the set of the at least two first actors 310, 311 is used permanently, the second input channel 411b is not necessary. The actor is then a "Duplicate" according to the prior art represented in FIG. 1b which initializes a clock at the end of the transfer of the data. Similarly, an actor 320 can comprise as many output channels as there are computation branches.

Figure 4C:
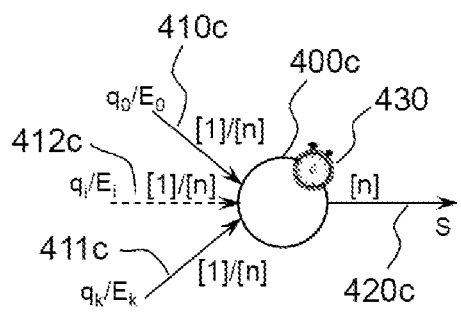

FIG. 4c represents an example of actor 400c of a graph according to the invention. This actor, also called "Transaction", is intended to select, out of a set of input channels, the one whose quality descriptor is the most favorable, and to transfer the associated result to an output channel. It can thus fulfill the role of a fourth actor 330 of a graph according to the invention.

To this end, the actor 400c comprises at least two input channels 410c, 411c. It can comprise as many input channels as there are computation branches in the graph. For example it can comprise a third input channel 412c. Each of the input channels comprises an input data set and a quality descriptor thereon. These input data and quality descriptor correspond to the output of the at least two first actors 310, 311 or computation branches.

At the latest at the interrupt signal from clock 330 initialized by an actor 320, the actor 400c selects the channel out of the at least two input channels 410c, 411c exhibiting the most favorable quality descriptor and transfers its output data to its output channel 420c.

Depending on the execution of the graph, all the computation branches have not necessarily terminated their computation at the interrupt signal from the clock. In this case, a computation branch that has not terminated its computation produces neither output data nor quality descriptor. In a set of embodiments of the invention, the fourth actor 330, for example a "Transaction" actor 430, comprises means for generating an error when, at the interrupt signal from the clock, the number from the at least two first actors having produced a quality descriptor is below a predefined threshold. In one embodiment of the invention, this threshold depends on operational characteristics. For example, in a geolocation application, a measurement can be considered as reliable if a choice between the result of at least two branches is made. In this case, the actor 400c comprises means for generating an error when, at the interrupt signal from the clock, fewer than two input channels present a quality descriptor. In another embodiment of the invention, the real-time constraints involve having a result on at least one computation branch at the interrupt signal from the clock. This is for example the case in a graph intended to encode a video in real time with, for example, 25 images to be encoded per second. In this case, an actor 400c can comprise means for generating an error if no result is available at the interrupt signal from the clock.

In a set of embodiments of the invention the selection by a fourth actor 330, for example a "Transaction" actor 400c, of the actor or of the branch whose quality criterion exhibits the most favorable value is performed at the interrupt signal from the clock. In another set of embodiments of the invention, this selection can be made before the interrupt signal from the clock. For example, this selection can be made when at least a predefined number from the at least two first actors have produced a quality descriptor. In one embodiment of the invention, the selection can be made if all of the input channels 410c, 411c, 412c, . . . of a "Transaction" actor 400c have produced a quality descriptor, and therefore if all the at least two first actors 310, 311 . . . have terminated their computation. In another embodiment of the invention, a graph can be configured to select the most favorable result if at least a certain number of branches have terminated their computation.

This allows a great flexibility in the choice of the best computation result. For example, in the case of a geolocation application comprising three actors for the computation of the position of a user (for example, one by odometry, one using GPS signals and one using GSM signals), it is possible to define the following rules for the most accurate position selection. If, before the interrupt signal from the clock, at least two actors have terminated their computation and supplied a location and an accuracy, the most accurate location out of the two is selected. By default, at the interrupt signal from the clock, if one of the actors has terminated its computation, the position returned is selected. The compilation of a graph according to the invention makes it possible to ensure that a computation result is returned within the desired time. However, if, in case of anomaly in the execution of the graph (for example, hardware failure or error intrinsically unpredictable) such was not the case, and if no actor has terminated its geolocation computation, an error is generated.

The "Transaction" actor 400c is given solely as an example of a fourth actor 330 of a graph according to the invention.

Figure 4D:
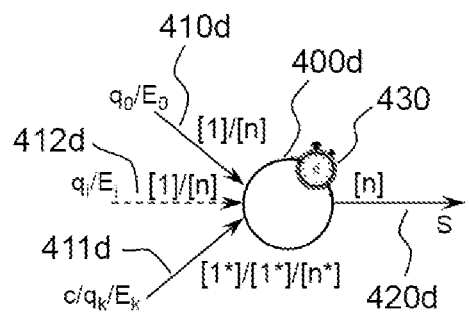

FIG. 4d represents an example of actor 400d of a graph according to the invention. This actor, called "Iterative-Transaction", is a specialization of a "Transaction" actor 400c.

This actor 400d is largely similar to the actor 400c. It notably comprises as many input channels as there are computation branches, with at least two input channels 410d and 411d, and for example a third input channel 412d. It also comprises an output channel 420d and selects the most favorable result out of its input channels having produced a quality descriptor at the latest at the interrupt signal from the clock 430.

The actor 400d is distinguished form the actor 400c in that at least one out of the at least two first actors 310, 311 linked to the input channel, for example the channel 411d, produces an update of its datum or of its data set, and of its associated quality descriptor. In a set of implementations of the invention, said actor produces successive results and quality descriptors, and gives a token to a semaphore when its execution is terminated.

This operation is particularly suited to iterative algorithms progressively improving their result by successive iterations. In one embodiment of the invention, at the interrupt signal from the clock, the "IterativeTransaction" actor 400d considers the last results and quality descriptor supplied by said actor to select the best result out of its input channels. In one embodiment of the invention, at the interrupt signal from the clock, the "IterativeTransaction" actor 400d checks the presence of a computation result and of a quality descriptor on an input channel associated with an actor producing results iteratively, for example the channel 411d, to check the number of results available. In one embodiment of the invention, the "IterativeTransaction" actor 411d triggers the selection of the most favorable result before the interrupt signal from the clock if the number of tokens received in a semaphore from the input channels is at least equal to a predefined threshold.

These properties allow a graph according to the invention to best exploit iterative algorithms. In particular, that makes it possible, at a predefined date, to recover the last result produced by the iterative algorithm, which is therefore the best available at that date. A graph according to the invention is also capable of comparing results produced by iterative and non-iterative algorithms. Finally, a graph according to the invention is capable of terminating the processing of the data earlier if the iterative algorithm has terminated its processing, which is intrinsically unpredictable.

The actor 400d is given as an example only of an actor 330 intended to select the most favorable computation result at the latest at the interrupt signal from a clock 430 while taking as input data from actors producing updates of their output data and quality descriptors.

Figure 5:
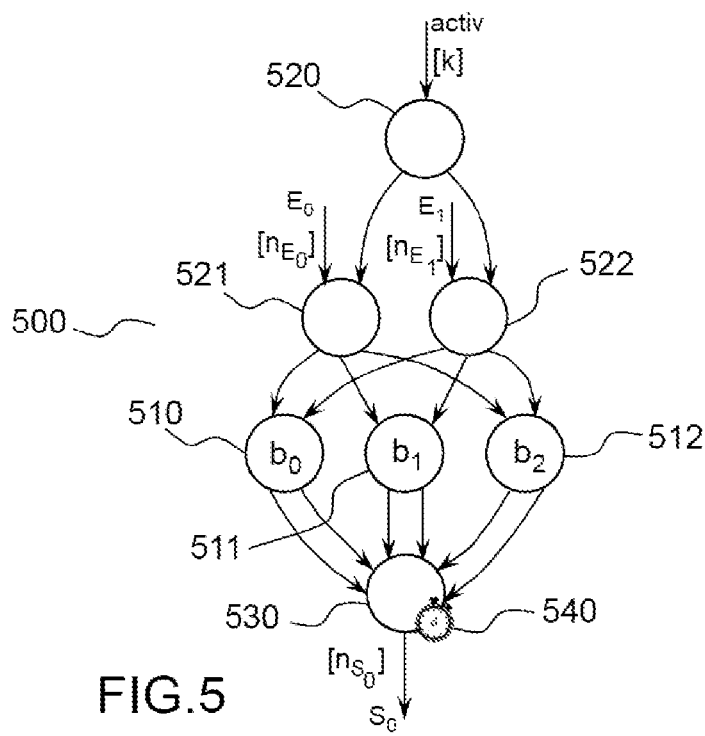
FIG. 5, an example of graph according to the invention, in which the branches of the module comprise two input channels.

FIG. 5 represents an example of graph according to the invention, in which the branches of the module comprise two input channels.

This graph, given only as an example, comprises three branches for the computation of an output datum, each consisting of an actor 510, 511, 512. Each actor comprises two input channels and two output channels and is similar to the actor 400a. It also comprises an actor 520 comprising means for triggering the execution of the computation of a subset of the actors 510, 511 and 512 following a list of branches to be executed obtained on its input channel. It also comprises means for initializing a clock 540 for emitting an interrupt signal when a duration has elapsed.

The actor 520 supplies the list of the branches to be executed to two actors 521, 522 of "SelectDuplicate" type 400b, each of these actors duplicating an input datum for each of the actors 510, 511, 512 to be executed. Thus, the actors 510, 511, 512 to be executed have two sets of identical input data. In one embodiment of the invention, each of the actors 521, 522 gives a token to a semaphore linked to each of the actors 510, 511, 512, and the execution of each of the actors 510, 511, 512 starts when its semaphore has received as many tokens as it has input channels. Each of the actors 510, 511, 512 produces a computation result and a quality descriptor as output.

In this graph, each branch 510, 511 and 512 is independent, and can consist of a single actor or of a conventional CSDF graph. It is thus possible to determine, for each of these graphs, an execution time, and therefore predict, for example on compilation, an execution time for certain branches. For branches whose execution time depends on the typology of the input data, it can be possible to provide a minimum and/or maximum execution time. Finally, it is possible to identify the branches for which no failure has been found to occur (for example, branches comprising only local computations), and the branches for which there is a risk of failure (for example, if the computation capacity depends on the reception of signals or if a part of the computation is performed on a remote platform).

Finally, a last actor 530 of "Transaction" type 400c selects, at the latest at the interrupt signal from the clock 540, the actor out of the actors 510, 511, 512 having produced the most favorable quality descriptor and transfers its result to the output channel of the graph.

Figure 6:
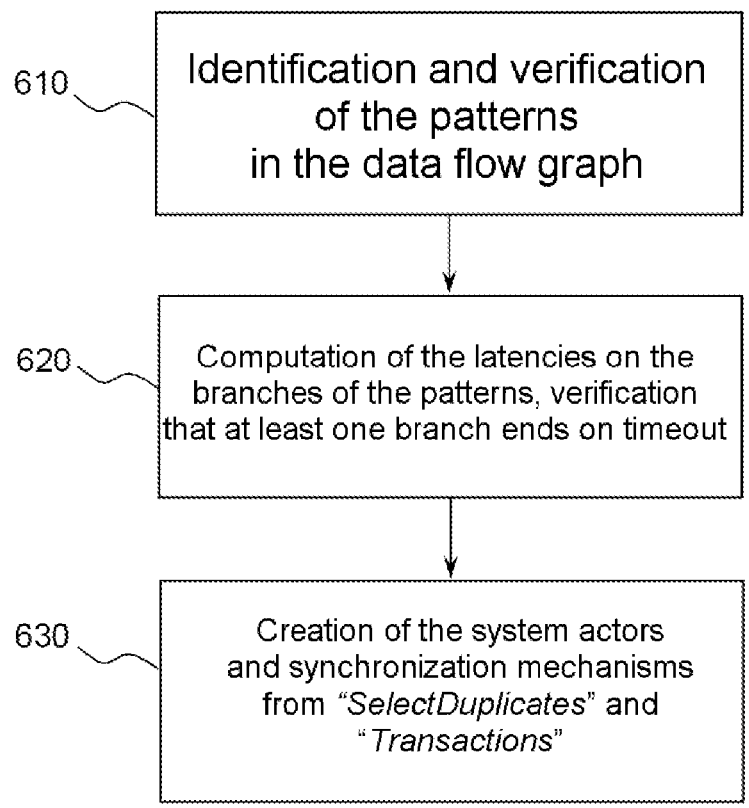
FIG. 6, an example of graph compilation method according to the invention.

FIG. 6 represents an example of graph compilation method according to the invention.

The aim of this method, given as an illustrative example only, is to analyze a graph, such as the graph 500 for example, and convert it into system actors in order to be able to execute it, while validating certain real-time execution constraints.

An example of graph compilation method according to the invention can comprise more specifically:

when the modules of a graph according to the invention are not created automatically, a step 610 of identification and verification of the patterns in a data flow graph;

a step 620 of computation of the latencies on the branches of the patterns, and of verification that at least one branch terminates on timeout;

a step 630 of creation of the system actors and synchronization mechanisms from "SelectDuplicates" and "Transactions".

The identification and the creation of graphs according to the invention can be performed directly by a programming interface. It is also possible, from a graph, for example the graph 500, to identify, in the step 610, the modules 300 of the graph according to the invention, then compile them specifically. In one implementation of the invention applied to the CSDF graphs, the step 610 can consist in the detection of the "TransactionModules" 300 in a CSDF graph. In the case where a programming interface makes it possible to directly insert modules according to the invention, a compilation method makes it possible to go directly to the step 620.

A graph compilation method according to the invention notably comprises a step of creation of at least two first groups of instructions of a computer code corresponding to the at least two first actors 310, 311 to independently execute the computation of a same datum or of a same data set, and to produce a quality descriptor on the result obtained, the execution of the computation by the at least two first groups of instructions of a computer code being triggered by a synchronization system. These at least two first actors 310, 311 can themselves constitute an independent computation branch, or form part of an independent computation branch for the computation of a datum or of a data set. In the latter case, the independent branch can be compiled according to a prior art method, for example like a branch of a CSDF graph.

The step 620 consists in identifying, in the context of the normal execution of the graph, the latency of each actor or independent branch. This step makes it possible to ensure that the graph is capable of producing a computation result in real time. It can for example consist of a step of verification that at least one out of the at least two first groups of instructions of a computer code is capable of executing its computation deterministically within a predefined duration. The computation of latency can also be applied to an independent branch, for example compiled like a conventional CSDF graph. This step can be executed before or after the creation of the at least two first actors 310, 311.

In one embodiment of the invention, the compilation algorithm returns a compilation error when none of the at least two groups of instructions of a computer code fulfils this criterion.

The step 630, which can for example be executed once the step 620 is validated, comprises the creation of system actors and synchronization mechanisms.

It can notably comprise a step of creation of a third group of instructions of a computer code corresponding to a third actor 320 to trigger the execution of the computation by each of said at least two first groups of instructions of a computer code, and initialize a clock configured to emit an interrupt signal when said predefined duration is terminated.

It can also comprise a step of creation of a fourth group of instructions of a computer code corresponding to a fourth actor 330 to execute, at the latest at the interrupt signal from the clock: the selection, out of the set of the at least two first groups of instructions of a computer code having produced a quality descriptor, of the one whose descriptor exhibits the most favorable value; the transfer of the datum or of the data set computed by the group of instructions of a selected computer code.

The paragraphs below describe in more detail, by way of example only, a set of system objects and a system support service making it possible to compile a graph according to the invention, and a compilation algorithm written in pseudo-code.

A system for executing a graph compiled by a method according to the invention can comprise a suitable support system service. This support system service can notably comprise means for transferring data. Many implementations are possible for the transfer of data. For example, it can be a memory copy, the sending of a memory address, complex protocols on dedicated bus or network protocols. It is also possible to have, for a same graph, several implementations of the data transfer according to the actors involved.

The support system service can also comprise means for managing time and interrupts. For example, these means can comprise the creation of a clock or the configuration of an interrupt. When the graph according to the invention comprises several inputs, it is possible to increment a counter each time an input is taken into account, and configure the clock or the interrupt, when the counter reaches the number of inputs, to produce an interrupt signal when a predefined duration times out. If each branch signals the end of its computation using a semaphore, the support system service can trigger the selection of the best result at the interrupt signal by filling all the semaphores linked to the different branches.

The support system service can also reinitialize all the actors of the module at the end of the transaction. It can notably, to do this, interrupt all the actors of the module, reinitialize them and the semaphores and the parameters of the system service. Thus, a new transaction can take place with new parameters.

A system for executing a graph according to the invention can also comprise specific system actors, which are created upon the compilation of a module.

In one embodiment of the invention, the compilation of a "SelectDuplicate" actor 400b produces the following system objects:

a semaphore for each branch with the capacity of one token each, initially empty;

an "AppInputTrigger": has the activation and data inputs, and triggers the transfer of data to the "BranchInputTriggers" linked to the active actors, and updates the timestamp once the transfer of the data is terminated;

a "BranchInputTrigger" for each branch: while waiting for the token supplied by the "AppInputTrigger", it triggers the provision of the data to the actors of the branch concerned and the activation of a branch.

In one embodiment of the invention, the compilation of a "Transaction" actor 400c or produces the following system objects:

a "BranchOutputTrigger" for each branch: has only the pair of inputs for the data and the quality descriptor. It is intended to trigger the transfer of the data to the "AppOutputTrigger" and to place a token in a semaphore to signal the end of the execution of its branch;

a semaphore whose number of inputs corresponds to the number of branches needed to trigger the selection of the best result;

an "AppOutputTrigger": the "AppOutputTrigger" waits for a number of tokens at least equal to the number of branches of the module on the semaphore. This semaphore can be filled either at the end of the execution of the branches, or at the interrupt signal from the clock. When the semaphore is filled, the "AppOutputTrigger" selects the most favorable result from the quality descriptors and triggers the transfer of the output data.

In one embodiment of the invention, the compilation of an "IterativeTranscation" actor 400d is similar to that of a "Transaction" actor 400c, apart from the fact that the "BranchOutputTrigger" is replaced by an "IterativeBranchOutputTrigger" for each iterative branch. The "IterativeBranchOutputTrigger" has, in addition to the "BranchOutputTrigger", a validation input for the iterative results.

The system actors above are given by way of example only. Other system actors are possible for implementing a graph according to the invention on different platforms.

The algorithms presented in the appendix, given by way of example only, make it possible to detect a graph according to the invention, to identify the independent branches, to verify that at least one branch is executed in a bounded time and to create system objects making it possible to execute the graph. In the context of these algorithms, a graph according to the invention is called a "TransactionModule". The algorithms below are written in an English-language pseudo-code whose keywords have the following meaning:

Input: algorithm input parameter

Output: algorithm output parameter

For . . . do . . . end: for all the elements cited between the "for" keyword and the "do" keyword, all of the loop between the "do" keyword and the first "end" keyword having the same level of indentation as the "for" keyword is executed;

If . . . then . . . end: if the condition located between "if" and "then" is borne out, all of the loop indented from the line below is executed, to the first "end" keyword having an indentation identical to the "if" keyword;

While . . . do . . . end: as long as the condition between the "while" keyword and the "do" keyword is borne out, the loop between the "do" keyword and the first "end" keyword having the same level of indentation as the first "while" keyword is performed;

If . . . then . . . else . . . end: if the condition between the "if" keyword and the "then" keyword is borne out, then all of the loop between the "then" keyword and the first "else" keyword having the same level of indentation as the "if" keyword is executed. Otherwise, all of the loop between the first "else" and "end" keywords having the same level of indentation as the "if" keyword is executed;

If . . . then . . . else if . . . then . . . end: if the condition between the "if" keyword and the "then" keyword is borne out, then all of the loop between the "then" keyword and the first "else" keyword having the same level of indentation as the "if" keyword is executed. Otherwise, if the condition between the "else if" keyword and the "then" keyword is borne out, all of the loop between the second "then" keyword and the first "end" keyword having the same level of indentation as the "if" keyword is executed.

Forall the . . . do . . . end: for all the elements cited between the "forall the" keyword and the "do" keyword, all of the loop between the "do" keyword and the first "end" keyword having the same level of indentation as the "for" keyword is executed;

The algorithm 1, and the other examples of algorithms presented in the present application also comprise mathematical or computing symbols which retain their conventional meaning. For example:

∈ means "belonging to" or "belongs to"
∉ means "not belonging to" or "does not belong to"
= means "is equal to"
≠ means "is different from"
← means an assignment of the value of the operand on the right to the operand on the left
∪ represents the union of the set situated in the operand on the right and the set situated in the operand on the left
| | represents the cardinal (size in terms of number of elements) of the set situated between the two vertical bars.

According to a standard widely applied in a large number of computer programs, the lines whose first two characters are "//" are comment lines. These lines are intended only to make it easier for a programmer to understand the code, and do not form part of the algorithm as such.

The algorithm 1 makes it possible, from a data flow graph, to identify all the graphs according to the invention, here called TransactionModule. The algorithm 2, given in the appendix, makes it possible to identify and verify the inputs of this graph.

The algorithm 3, in the appendix, comprises the identification and the verification of the outputs of the graph, and the identification of the actors on a path between an input and an output.

A graph according to the invention can form a part of a larger CSDF graph. However, outside of these main inputs and outputs, it should preferably not contain any external connection to one of the actors of the graph. The algorithm 4, an example of code of which is supplied in the appendix, makes it possible to verify this property.

In particular, this algorithm comprises, prior to the step of creation of at least two groups of instructions of a computer code corresponding to at least two first actors: a step of verification of the existence of the at least two first actors, of the third actor and of the fourth actor; a step of verification that the input channels of the at least two first actors are connected to the third actor; a step of verification that the output channels of the at least two first actors are connected to the fourth actor, a step of verification that the output channels of the third actor are connected to the at least two first actors; a step of verification that the input channels of the fourth actor are connected to the at least two first actors.

The algorithm 5, an example of code of which is supplied in the appendix, makes it possible to construct the actors for each of the branches and to verify that the branches are indeed independent.

Figure 7:
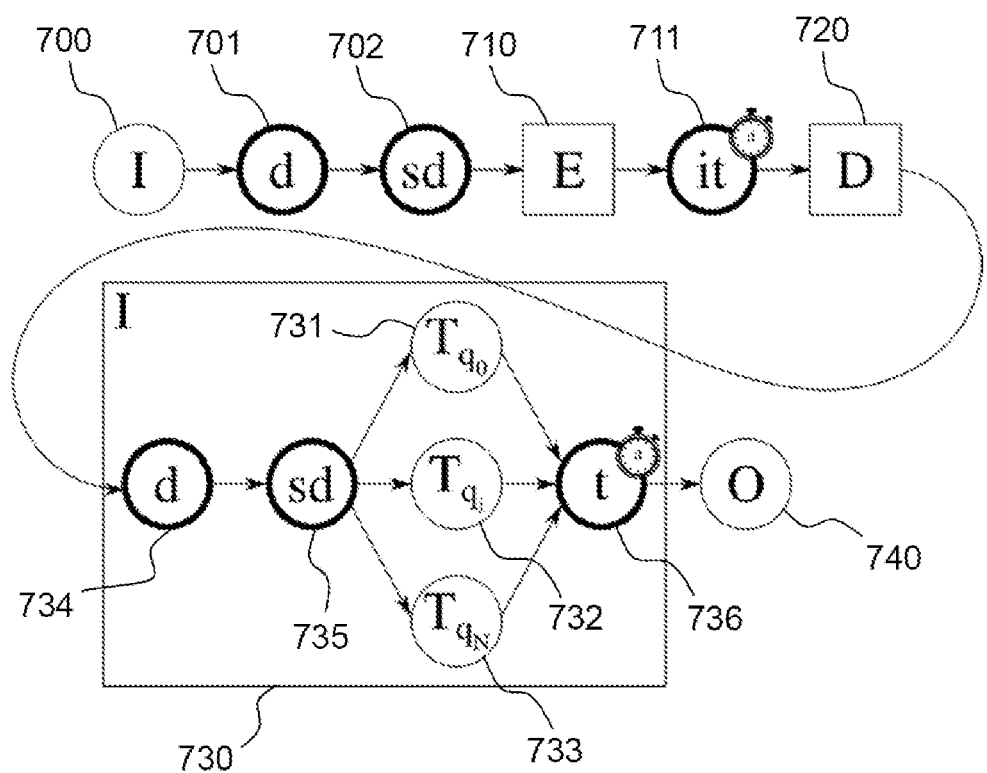
FIG. 7, an example of graph according to the invention for real-time image processing in the context of vehicle driving assistance.

FIG. 7 represents an example of graph according to the invention for processing real-time images in the context of vehicle driving assistance.

This application, given by way of example only, performs image processing with real-time constraints, in the context of an advanced driver assistance system (ADAS) for identifying signs (indications, speed limits, prohibitions). The application reads images of maximum size W×H, where W (Width) represents the width of the image and H its height, from an external source (sensor, video camera) at a frequency of 1/x, where x represents the image reading frequency. Each image is processed by a series of signal processing algorithms. This application must produce a plurality of sign descriptors identified within a limited duration from the acquisition of the image.

The graph 7 for processing images is executed for each new image to be analyzed. In the case where 25 images are produced per second, it must be executed in $\frac{1}{25}^{th}$ of a second. In the example, t will denote the maximum time allowed for the execution of the graph. The graph 7 receives, for each image, an input datum "I" 700. This datum can for example comprise the raw data of an image captured by the camera.

A first algorithmic actor "E" 710 consists in enhancing the input image. In the context of the graph, this actor is surrounded by three actors, "Duplicate" 701, "SelectDuplicate" 702 and "IterativeTransaction" 711. The "IterativeTransaction" actor 711 is linked to a clock ensuring that the step of enhancement of the image is executed at the maximum within a duration a. A second algorithmic actor "D" 720 makes it possible to identify the areas of interest, in this case the road signs. These actors can be compiled and executed like a CSDF graph according to the prior art.

Finally, a module "I" 730 of the graph according to the invention is responsible for analyzing the areas of interest in order to identify and extract the information from the road signs, The information extraction algorithms are complex to implement, and their execution time varies as a function of a quality parameter. In order to ensure that at least one result is obtained, and to obtain the best possible result according to several quality parameters within a deterministic time, a graph according to the invention is implemented. The maximum duration authorized for the analysis of the areas of interest will be denoted b.

This graph comprises a plurality of actors "$Tq_0$" 731, "$Tq_1$" 732 . . . "$Tq_N$" 733 making it possible to analyze the road signs according to different quality parameters. These actors are executed in parallel and make it possible to obtain a more or less reliable analysis, and an associated quality descriptor. In order to guarantee the supply of a result within the desired time, at least one out of the plurality of actors, for example the actor "$Tq_0$" 731, has a deterministic and bounded latency less than the duration b. The module of the graph 730 also comprises a "Duplicate" actor 734 and a "SelectDuplicate" actor 735 for supplying the areas of interest and input parameters to the plurality of actors 731, 732, . . . , 733, and initializing a clock that has to produce an interrupt signal at the end of the duration b. Finally, a "Transaction" actor 736 selects, at the latest at the interrupt signal from the clock, the actor out of the plurality of actors 731, 732, . . . , 733 having terminated its processing and produces the most favorable quality descriptor, and transfers its computation results to the output "O" 740.

A graph according to the invention therefore does indeed make it possible, in this case, to hold to the real-time constraints and to provide a computation result at the desired moment. It also makes it possible to select, at a limit date, the processing loop that has terminated its computation and supplied the result of the best available quality. It therefore makes it possible to guarantee the availability of a computation result in real time, while reserving the possibility of having the computation result exhibiting the best possible quality within the time allotted.

The examples given above are given by way of indication only, and in no way limit the scope of the invention, defined by the claims below.

APPENDICES

ALGORITHM 1: Identification and verification of the TransactionModules in a data flow graph

Input: Data flow graph (G(V, A))
Output: Set of TransactionModules (M)
M ← ∅
A ← ∅ // set of SelectDuplicates already processed
forall the v ∈ V do
    if v.type = SelectDuplicate ∧ v ∉ A then
        // identification of the input parameters of the module
        d ← v.port(activation).source
        if d.type ≠ Duplicate then
            error(the SelectDuplicates must receive their Duplicate activation schema)
        end
        n ← |v.sucessors|
        // identification/verification of the inputs of the module
        // see ALGORITHM 2
        D ← moduleInputs(d, n)
        A ← A ∪ D
        // identification/verification of the outputs (T)
        // identification of the actors between an input and an output
        // see ALGORITHM 3
        (S, T) ← moduleOutputs(D, n)
        // verification that all the predecessors of the actors are in the module
        // i.e. no external connection
        // see ALGORITHM 4
        moduleCheck(S, D)
        // construction of the sets of actors per branch
        // verification that the branches are independent
        // see ALGORITHM 5
        B ← moduleBranches(S, D, n)
        M ← M ∪ {[d, D, B, T]}
    end
end

ALGORITHM 2: Identification and verification of the inputs of a TransactionModule
Input: Duplicate of the module (d), Number of branches of the module (n)
Output: Set of SelectDuplicates (D)

D ← ∅;
forall the s ∈ d.sucessors, s.type = SelectDuplicate do
    if |s.sucessors| ≠ n then
        error(the number of branches is incorrect for the input s)
    end
    D ← {s} ∪ D
end

| ALGORITHM 3 : Identification and verification of the outputs of a TransactionModule, identification of the actors on a path between an input and an output |
|---|

Input : Set of SelectDuplicates (D), Number of branches (n)
Output : Set of Transactions (T), Set of actors on a path between input and output (S)
T ← ∅
S ← ∅
t ← [.type = Undefined, .deadline = 0] // type of Transactions
I ← D
while I ≠ ∅ do
    i, i ∈ I
    for s ∈ i.successors, s ∉ S do
        if s.type = Transaction ∨ s.type = IterativeTransaction then
            if t.type = Undefined then
                t ← [.type = s.type, .deadline = s.deadline]
            else if t ≠ s then
                error(Transaction types incompatible for the output s)
            end
            if |s.predecessors| ≠ n then
                error(the number of branches is incorrect for the output s)
            end
            T ← T ∪ {s}
        else
            I ← I ∪ {s}
        end
    end
    S ← S ∪ {i}
    I ← I \ {i}
end

ALGORITHM 4: Verification that all the predecessors of the actors are in the module (no external connection)

Input: Set of actors (S), Set of SelectDuplicates (D)
Output:
forall the $a \in S$ do
    forall the $p \in$ a.predecessors do
        if $p \notin S \wedge p \notin D$ then
            error(connection to a of an actor p external to the module)
        end
    end
end

ALGORITHM 5: Construction of the sets of actors per branch and verification that the branches are independent

Input: Set of actors (S), Set of SelectDuplicates (D), Number of branches (n)
Output: Set of branches (B)
$B \leftarrow \emptyset$
for $i \leftarrow 0$ to $n - 1$ do
    // all the actors such that there is a path from an input of the module
    // to the actor
    $B_i \leftarrow \{a \in S \mid \exists d_i \in D, (d_i.port(out_j).destination, \ldots, a)\}$
    $B \leftarrow B \cup B_i$
end
for $i \leftarrow 0$ to $n - 1$ do
    for $j \leftarrow 0$ to $n - 1$ do
        if $j = i \wedge B_i \cap B_j = \emptyset$ then
            error(the branches i and j are not independent)
        end
    end

The invention claimed is:

1. A computer system for executing instructions for compiling a data flow graph, said data flow graph comprising:
    at least two first actors, each comprising means for independently executing a computation of a same data set comprising at least one datum, and producing a quality descriptor of the data set, said quality descriptor being defined in a scale of values ranging from least favorable to most favorable values according to a type of computation executed by the at least two first actors, the execution of the computation by each of said at least two first actors being triggered by a synchronization system, wherein the at least two first actors execute in parallel;
    a third actor, comprising means for triggering the execution in parallel of the computation by each of said at least two first actors, and initializing a clock configured to emit an interrupt signal when a duration of said clock has elapsed; and
    a fourth actor, comprising means for executing, at the latest at the interrupt signal from said clock:
        a selection, from a set of said at least two first actors having produced a quality descriptor, of an actor in said set whose descriptor exhibits the most favorable value in the scale among the quality descriptors of the actors of said set; and
        a transfer of the data set computed by the selected actor.

2. The system for executing instructions for compiling a data flow graph as claimed in claim 1, wherein at least one of said two first actors is configured to be executed deterministically in a time less than or equal to the duration of the clock.

3. The system for executing instructions for compiling a data flow graph as claimed in claim 1, wherein the synchronization system of each of said at least two first actors is a semaphore, and the third actor triggers the execution of the computation by each of said at least two first actors by giving a token to said semaphore.

4. The system for executing instructions for compiling a data flow graph as claimed in claim 1, wherein the third actor comprises means for transferring data representing identical computation parameters to each of said at least two first actors, prior to the initialization of the clock.

5. The system for executing instructions for compiling a data flow graph as claimed in claim 4, wherein each of the at least two first actors, produces a timestamp at the end of the transfer of the data representing computation parameters, and the third actor triggers the initialization of the clock after the reception of the at least two timestamps.

6. The system for executing instructions for compiling a data flow graph as claimed in claim 1, wherein the third actor is configured to trigger the execution of a subset of the at least two first actors, as a function of a parameter external to said third actor indicating the subset of the at least two first actors to be executed.

7. The system for executing instructions for compiling a data flow graph as claimed in claim 6, wherein the subset of the at least two first actors to be executed comprises all those for which the computation means allowing their execution are available.

8. The system for executing instructions for compiling a data flow graph as claimed in claim 1, wherein the fourth actor comprises means for generating an error, when, at the interrupt signal from the clock, the number out of the at least two first actors having produced a quality descriptor is below a predefined threshold.

9. The system for executing instructions for compiling a data flow graph as claimed in claim 1, wherein the fourth actor is configured to select the actor whose quality criterion exhibits the most favorable value in the scale at the interrupt signal from the clock.

10. The system for executing instructions for compiling a data flow graph as claimed in claim 1, wherein the fourth actor is configured to select the actor whose quality criterion exhibits the most favorable value in the scale before the interrupt signal from the clock, when at least a predefined number out of the at least two first actors have produced a quality descriptor.

11. The system for executing instructions for compiling a data flow graph as claimed in claim 1, wherein at least one out of the at least two first actors is configured to produce an update of the computation of its data set, and of its quality descriptor.

12. A computer-implemented method for executing instructions for compiling a data flow graph, said method comprising:
    a step of creation of at least two groups of instructions of a computer code corresponding to at least two first actors for independently executing the computation of a same data set comprising at least one datum, and producing a quality descriptor of the data set, said quality descriptor being defined in a scale of values ranging from least favorable to most favorable values according to a type of computation executed by the at least two first actors, the execution of the computation by each of said at least two groups of instructions of a computer code being triggered by a synchronization system, wherein the at least two groups execute in parallel;
    a step of verification that at least one out of the at least two groups of instructions of a computer code is capable of executing its computation deterministically within a predefined duration of said clock;
    a step of creation of a third group of instructions of a computer code corresponding to a third actor, for triggering the execution in parallel of the computation by each of said at least two groups of instructions of a computer code, and initializing a clock configured to emit an interrupt signal when said predefined duration of said clock is terminated; and
    a step of creation of a fourth group of instructions of a computer code corresponding to a fourth actor, for executing, at the latest at the interrupt signal from said clock:
        a selection, from a set of said at least two groups of instructions of a computer code having produced a quality descriptor, of the one whose descriptor exhibits the most favorable value in the scale; and
        a transfer of the data set computed by the group of instructions of a selected computer code.

13. The method as claimed in claim 12, comprising, prior to the step of creation of at least two groups of instructions of a computer code corresponding to at least two first actors:
    a step of verification of the existence of the at least two first actors, of the third actor and of the fourth actor;
    a step of verification that the input channels of the at least two first actors are connected to the third actor;
    a step of verification that the output channels of the at least two first actors are connected to the fourth actor;
    a step of verification that the output channels of the third actor are connected to the at least two first actors;
    a step of verification that the input channels of the fourth actor are connected to the at least two first actors.

14. The method as claimed in claim 12, wherein a compilation error is generated when none of the at least two first groups of instructions of a computer code corresponding to at least two first actors is capable of executing its computation deterministically within said predefined duration of said clock.

\* \* \* \* \*